(12) United States Patent
Ma et al.

(10) Patent No.: US 11,316,000 B2
(45) Date of Patent: Apr. 26, 2022

(54) ARRAY SUBSTRATE INCLUDING METAL STRIP, MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hongwei Ma, Beijing (CN); Kai Zhang, Beijing (CN); Yunsheng Xiao, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 436 days.

(21) Appl. No.: 16/466,531

(22) PCT Filed: Nov. 21, 2018

(86) PCT No.: PCT/CN2018/116770
§ 371 (c)(1),
(2) Date: Jun. 4, 2019

(87) PCT Pub. No.: WO2019/174297
PCT Pub. Date: Sep. 19, 2019

(65) Prior Publication Data
US 2021/0358956 A1    Nov. 18, 2021

(30) Foreign Application Priority Data
Mar. 14, 2018   (CN) .......................... 201810208808.7

(51) Int. Cl.
*H01L 27/32*      (2006.01)
*H01L 27/12*      (2006.01)

(52) U.S. Cl.
CPC ........ *H01L 27/3276* (2013.01); *H01L 27/124* (2013.01); *H01L 27/1218* (2013.01);
(Continued)

(58) Field of Classification Search
CPC ............. H01L 27/3276; H01L 27/3297; H01L 27/1214; H01L 27/124; H01L 27/1244;
(Continued)

(56) References Cited

U.S. PATENT DOCUMENTS 9,195,108 B2   11/2015  Park et al.
10,591,789 B2   3/2020  Zhang et al.
(Continued)

FOREIGN PATENT DOCUMENTS

CN      103715140 A    4/2014
CN      105280673 A    5/2015
(Continued)

OTHER PUBLICATIONS

The First Chinese Office Action dated May 6, 2020; Appln. No. 201810208808.7.
(Continued)

*Primary Examiner* — Scott B Geyer

(57) ABSTRACT

An array substrate, a manufacturing method thereof and a display device are disclosed. The array substrate includes a base substrate; a first metal layer on the base substrate; a first insulating layer on the first metal layer; a second metal layer on the first insulating layer; and a second insulating layer located on the second metal layer. The array substrate includes a display region and a peripheral region surrounding the display region, the first metal layer includes a plurality of signal lines in the peripheral region, the second
(Continued)

insulating layer includes at least one groove overlapping at least two signal lines, the second metal layer includes a metal strip in the peripheral region, and in the area where the groove overlaps the signal lines, an orthographical projection on the base substrate fall into the orthographic projection of the metal strip on the base substrate.

20 Claims, 7 Drawing Sheets

(52) U.S. Cl.
CPC ...... *H01L 27/1262* (2013.01); *H01L 27/1259* (2013.01); *H01L 27/3258* (2013.01); *H01L 27/3262* (2013.01)

(58) Field of Classification Search
CPC ............ H01L 27/1248; H01L 27/1259; G09G 3/3233–325; G09G 2300/0408
See application file for complete search history.

(56) References Cited

U.S. PATENT DOCUMENTS

| | | | |
|---|---|---|---|
| 2008/0062074 A1 | 3/2008 | Yaegashi | |
| 2013/0148312 A1 | 6/2013 | Han et al. | |
| 2015/0380679 A1 | 12/2015 | Fujiyoshi et al. | |
| 2016/0276373 A1 | 9/2016 | Kim et al. | |
| 2016/0306208 A1 | 10/2016 | Hayashi | |
| 2017/0052403 A1 | 2/2017 | Iwato | |
| 2017/0125505 A1 | 5/2017 | Oh | |
| 2017/0229527 A1 | 8/2017 | Baek et al. | |
| 2017/0277288 A1 | 9/2017 | Choi et al. | |
| 2019/0311657 A1 | 10/2019 | Wang et al. | |

FOREIGN PATENT DOCUMENTS

| | | |
|---|---|---|
| CN | 105161506 A | 12/2015 |
| CN | 106653796 A | 8/2016 |
| CN | 107068695 A | 8/2017 |
| CN | 107230680 A | 10/2017 |
| CN | 107678196 A | 10/2017 |
| CN | 108447872 A | 8/2018 |
| JP | 2005183836 A | 7/2005 |

OTHER PUBLICATIONS

International Search Report dated Jan. 30, 2019; PCT/CN2018/116770.
The First Indian Office Action dated Jun. 12, 2021; Appln. No. 201947034614.
The extended European search report dated Nov. 17, 2021; Appln. No. 18905908.2.

ARRAY SUBSTRATE INCLUDING METAL STRIP, MANUFACTURING METHOD THEREOF AND DISPLAY DEVICE

The present application claims the priority of Chinese Patent Application No. 201810208808.7, filed on Mar. 14, 2018, and the disclosure of the above-mentioned Chinese Patent Application is incorporated herein in its entirety as a part of this application.

TECHNICAL FIELD

Embodiments of the disclosure relate to an array substrate, a manufacturing method thereof and a display device.

BACKGROUND

With the continuous development of display technology, low temperature poly-silicon active matrix light emitting diode (LTPS-AMOLED) display devices have become the research hotspot due to the advantages of wide color gamut, high contrast, low power consumption, light weight, flexibility and bendability, and been regarded as a new generation of display technology. On the other hand, with the continuous development of smart phones and smart televisions, the design regarding narrow and ultra-narrow borders has become the mainstream and competition trend in the market.

Generally, the backplane circuit of a low temperature poly-silicon active matrix light emitting diode display device includes layers of metal signal lines and insulating layers, and the structure is relatively complex.

SUMMARY

At least an embodiment of the present disclosure provides an array substrate comprising: a base substrate; a first metal layer on the base substrate; a first insulating layer on one side of the first metal layer away from the base substrate; a second metal layer on one side of the first insulating layer away from the base substrate; and a second insulating layer located at one side of the second metal layer away from the base substrate. The array substrate includes a display region and a peripheral region surrounding the display region, the first metal layer includes a plurality of signal lines in the peripheral region, the second insulating layer includes at least one groove overlapping at least two signal lines in the plurality of signal lines in the peripheral region, the second metal layer includes a metal strip in the peripheral region, and an orthographic projection of the signal lines on the base substrate falls into an orthographic projection of the metal strip in an area where the groove overlaps the signal lines.

For example, in the array substrate provided by an embodiment of the present disclosure, the metal strip comprises a plurality of metal strips, the plurality of metal strips are arranged one-to-one corresponding to the plurality of signal lines, and the orthographic projection of each signal line on the base substrate falls into the orthographic projection of the corresponding metal strip arranged on the base substrate in the area where the groove overlaps with the signal lines.

For example, in the array substrate provided in an embodiment of the present disclosure, the width of each of the metal strips is larger than the width of each of the signal lines in the area where the groove overlaps the signal lines.

For example, in the array substrate provided in an embodiment of the present disclosure, the plurality of signal lines extend into the display region.

For example, in the array substrate provided in an embodiment of the present disclosure, the second metal layer includes a conductive pattern in the display region, and each of the metal strips is insulated from the conductive pattern.

For example, in the array substrate provided by an embodiment of the present disclosure, the material of the first insulating layer includes an inorganic insulating material, and the material of the second insulating layer includes an inorganic insulating material.

For example, in the array substrate provided in an embodiment of the present disclosure, the groove penetrates through the first insulating layer in a direction perpendicular to the base substrate in a area where the metal strip is not provided in the peripheral region.

For example, in the array substrate provided in an embodiment of the present disclosure, the first metal layer is a first gate electrode metal layer and the second metal layer is a second gate electrode metal layer.

For example, in the array substrate provided by an embodiment of the present disclosure, the second insulating layer includes an interlayer dielectric layer.

For example, the array substrate provided by an embodiment of the present disclosure further includes a third metal layer located on one side of the second insulating layer away from the second metal layer; the third metal layer includes metal residue located at the bottom corner of the groove in the peripheral region.

For example, in the array substrate provided by an embodiment of the present disclosure, the third metal layer includes at least one of a source electrode, a drain electrode, and a source-drain signal line in the display region.

For example, the array substrate provided by an embodiment of the present disclosure further includes: a passivation layer disposed on a side of the third metal layer away from the second insulating layer; and a pixel electrode located at the display region and on the side of the passivation layer away from the third metal layer.

At least an embodiment of the present disclosure provides a display device including the array substrate according to any one of the above embodiments.

At least an embodiment of the present disclosure provides a method of manufacturing an array substrate, which comprises: forming a first metal layer on a base substrate; forming a first insulating layer on one side of the first metal layer away from the base substrate; forming a second metal layer on a side of the first insulating layer away from the base substrate; forming a second insulating layer on one side of the second metal layer away from the base substrate; and etching the second insulating layer to form at least one groove. The array substrate comprises a display area and a peripheral area surrounding the display area, the first metal layer comprises a plurality of signal lines in the peripheral area, the groove overlaps with at least two signal lines in the plurality of signal lines, the second metal layer comprises a metal strip in the peripheral area, and in the area where the groove overlaps with the signal lines, the orthographic projection of the signal lines on the base substrate falls into the orthographic projection of the metal strip on the base substrate.

For example, in the method of manufacturing the array substrate provided by an embodiment of the present disclosure, the metal strip comprises a plurality of metal strips, the plurality of metal strips are arranged one-to-one corresponding to the plurality of signal lines, and the orthographic projection of each signal line on the base substrate falls into the orthographic projection of the corresponding metal strip arranged on the base substrate in the area where the groove overlaps with the signal line.

For example, in the method of manufacturing the array substrate provided by an embodiment of the present disclosure, the width of each of the metal strips is larger than the width of each of the signal lines in the area where the groove overlaps with the signal lines.

For example, in the method of manufacturing the array substrate provided by an embodiment of the present disclosure, the second metal layer includes a conductive pattern in the display region, each of the metal strips is insulated from the conductive pattern, and the metal strips and the conductive pattern are manufactured through the same mask process.

BRIEF DESCRIPTION OF THE DRAWINGS

In order to make objects, technical details and advantages of the embodiments of the present disclosure, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In research, the inventors of this application found that in order to prevent a crack from spreading into a display area, the edge of the array substrate usually is usually formed with at least one groove in the interlayer dielectric layer. However, in the process of manufacturing the aforesaid array substrate, when the preparation process and the patterning process of the metal layer (e.g., the third metal layer hereinafter) are performed on the interlayer dielectric layer on which the groove has been formed, a residual of the metal layer remains at the bottom corner position of the groove. The metal residual may electrically connect different metal signal lines, thus causing a short circuit, and further causing poor display of the display device comprising the array substrate.

Figure 1:
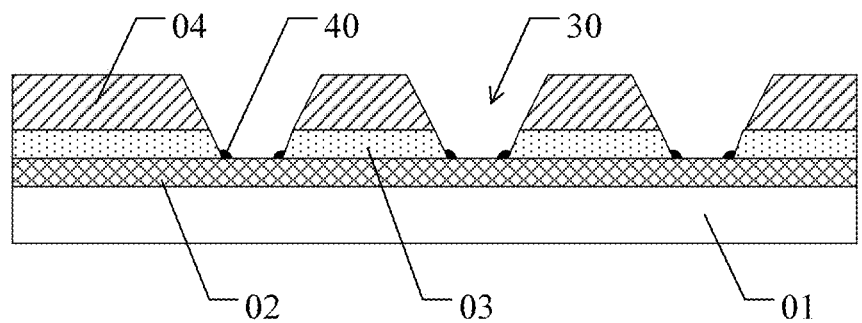
FIG. 1 is a schematic cross-sectional view of an array substrate.
Figure 2:
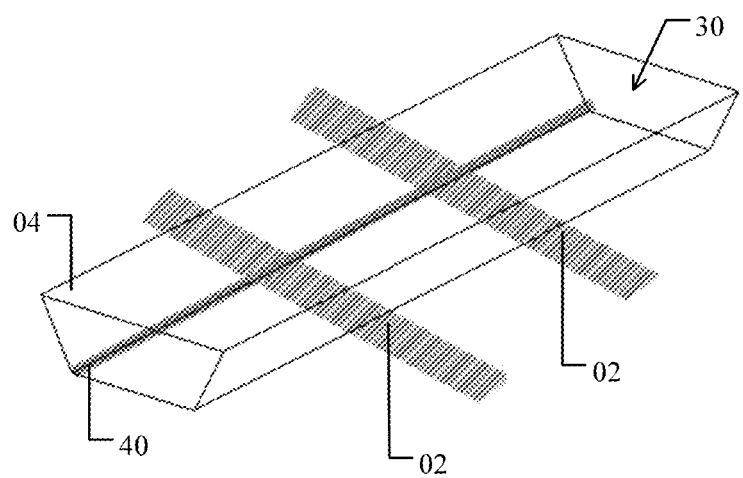
FIG. 2 is a schematic view of a short circuit caused by a metal residue.

FIG. 1 is a schematic cross-sectional view of an array substrate. FIG. 1 shows only the peripheral area of the array substrate. As shown in FIG. 1, the array substrate includes a base substrate 01, a signal line 02 provided on the base substrate 01, a first insulating layer 03 provided on the signal line 02, and a second insulating layer 04 provided on the first insulating layer 03. For example, the second insulating layer 04 is an interlayer dielectric layer. In order to prevent a crack from spreading into a display region, at least one groove 30 is formed in the peripheral region of the array substrate. The groove 30 penetrates the first insulating layer 03 and the second insulating layer 04 and exposes the signal line 02. However, when the preparation process and the patterning process of the third metal layer are performed subsequently, the metal residue 40 of the third metal layer appears at the bottom corner position of the groove 30. FIG. 2 shows a schematic view of short circuit caused by a metal residue. As shown in FIG. 2, the metal residue 40 at the bottom corner of the groove 30 electrically connects different signal lines 02, thereby causing a short circuit, and further causing poor display of the display device comprising the array substrate. It should be noted that the above-mentioned signal lines 02 can be obtained by patterning the first gate electrode metal layer.

Figure 3A:
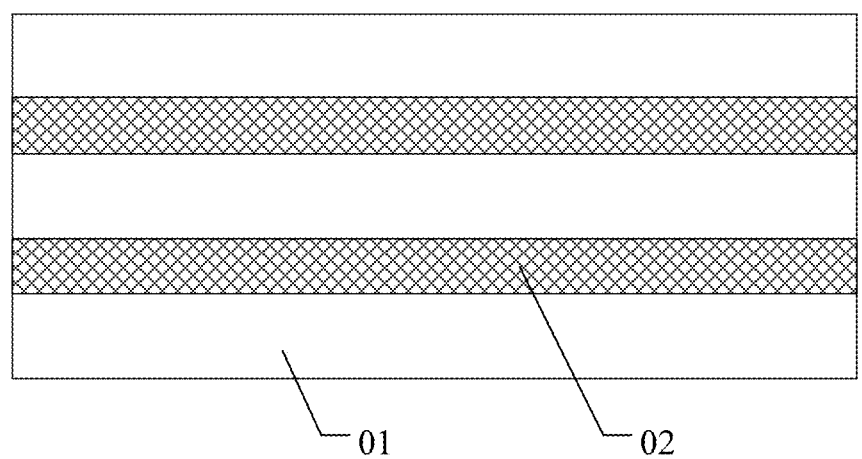
FIG. 3A to FIG. 3F are schematic views showing the steps of a method of manufacturing an array substrate.
Figure 3B:
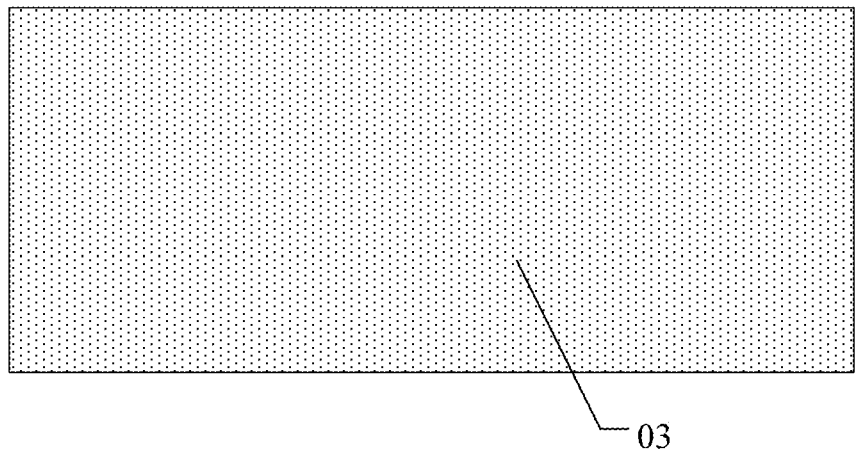
Figure 3C:
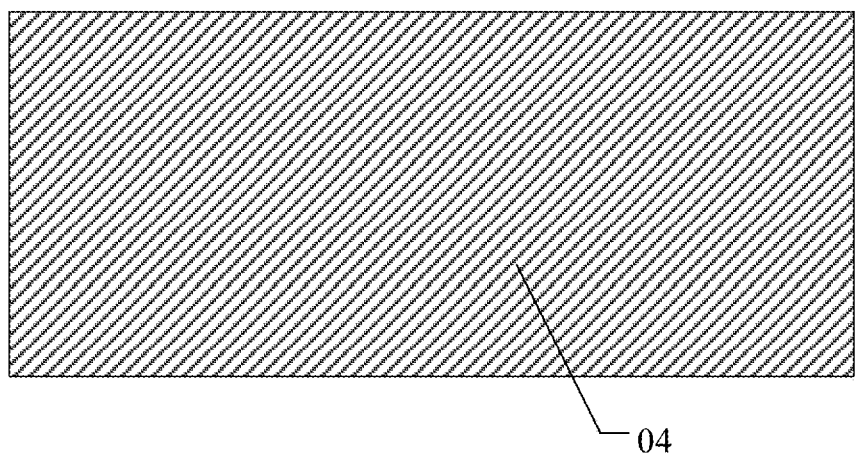
Figure 3D:
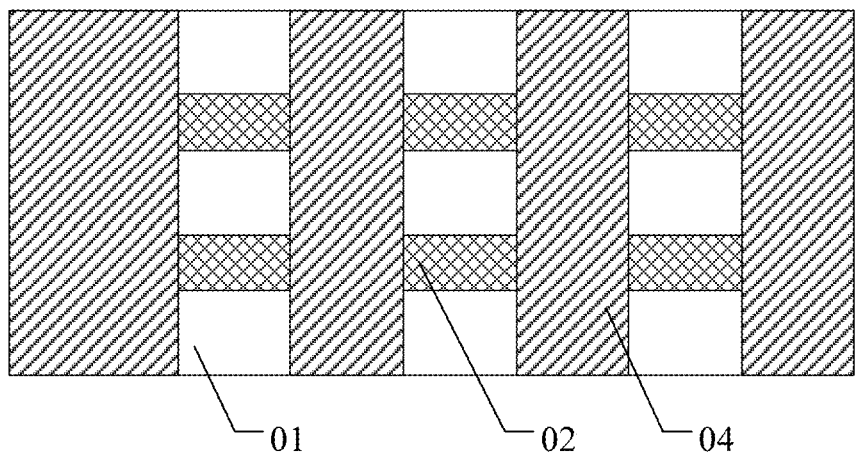
Figure 3E:
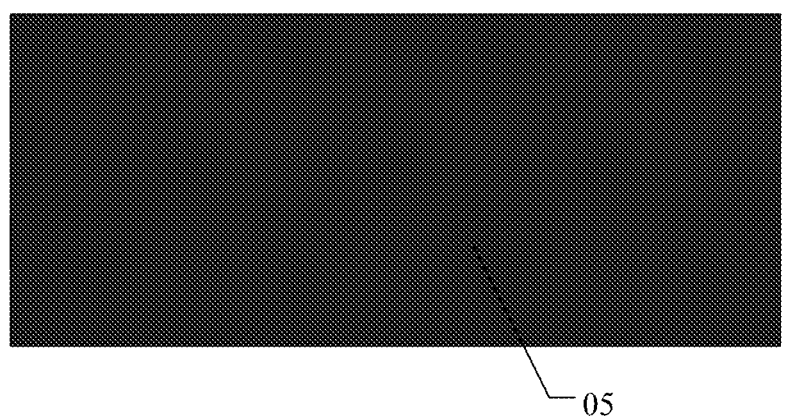
Figure 3F:
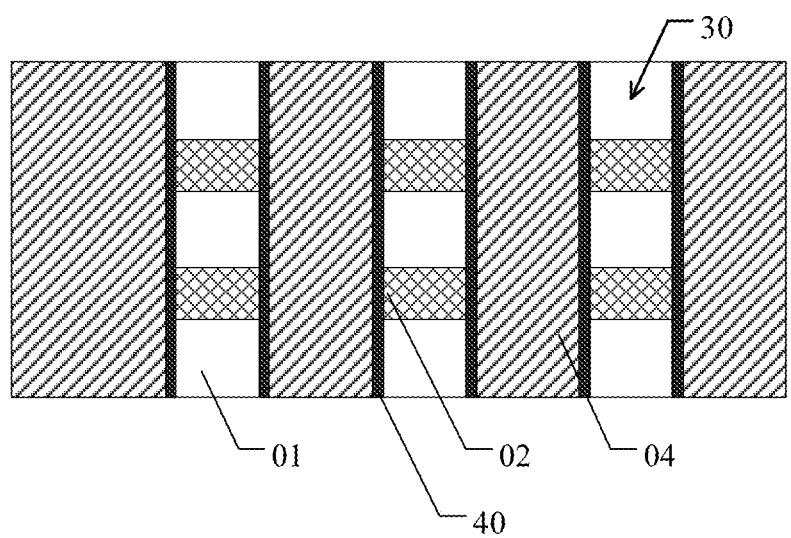

In order to more clearly explain the above signal line short-circuit problem caused by the metal residue, FIG. 3A to FIG. 3F show the schematic views of steps of a method of manufacturing an array substrate. Similarly, FIG. 3A to FIG. 3F only show peripheral regions of the array substrate. As shown in FIG. 3A, signal lines 02 are formed on a substrate 01. The signal lines 02 can be obtained by first forming a metal layer and then patterning the metal layer. As shown in FIG. 3B, a first insulating layer 03 is formed on the base substrate 01 and the signal lines 02, and the first insulating layer 03 covers the signal lines 02; as shown in FIG. 3C, a second insulating layer 04 is formed on the first insulating layer 03, for example, both the first insulating layer 03 and the second insulating layer 04 can be inorganic insulating layers; as shown in FIG. 3D, the second insulating layer 04 is etched to form at least one groove 30, because the second insulating layer 04 and the first insulating layer 03 are both inorganic insulating layers, the etching solution also etches the first insulating layer 03 at the position where the groove 30 is located in the process of etching the second insulating layer 04, thereby exposing the signal lines 02. As shown in FIG. 3E, a third metal layer 05 is deposited on the above-mentioned substrate, and at this time the third metal layer 05 is also deposited in the groove 30. As shown in FIG. 3F, the third metal layer 05 is etched and the third metal layer 05 in the peripheral region is removed. Because the third metal layer 05 is also deposited in the groove 30, a metal residue 40 is easily generated at the bottom corner position of the groove 30 in the process of etching the third metal layer 05. As shown in FIG. 3F, the metal residue 40 at the bottom corner of the groove 30 electrically connects the different signal lines 02, thereby causing a short circuit and further causing poor display of the display device using the array substrate. It should be noted that when the third metal layer is not used as a signal line, the third metal layer only has a pattern in the display area and needs to be completely removed in the peripheral area. In addition, after forming the first insulating layer and before forming the second insulating layer, the manufacturing method further comprises forming a second metal layer (e.g., a second gate electrode metal layer), the second metal layer also only has a pattern in the display region, and needs to be completely removed in the peripheral region.

Figure 4A:
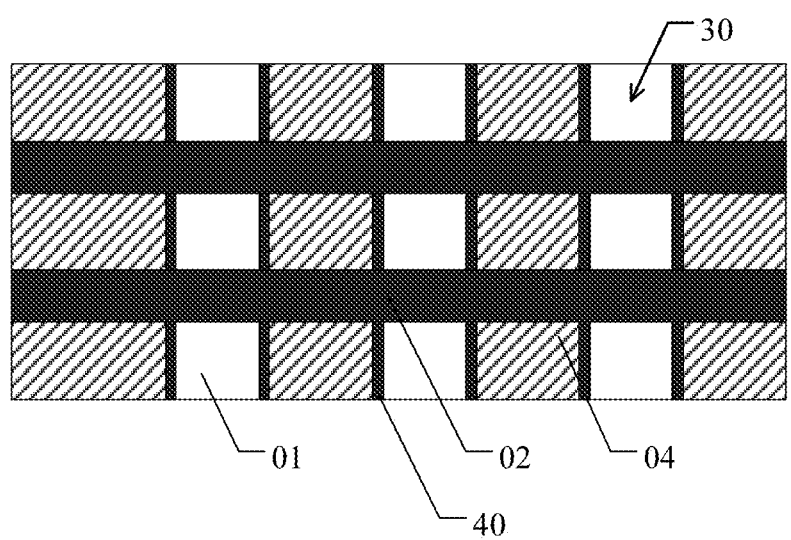
FIG. 4A is a schematic plan view of another array substrate.
Figure 4B:
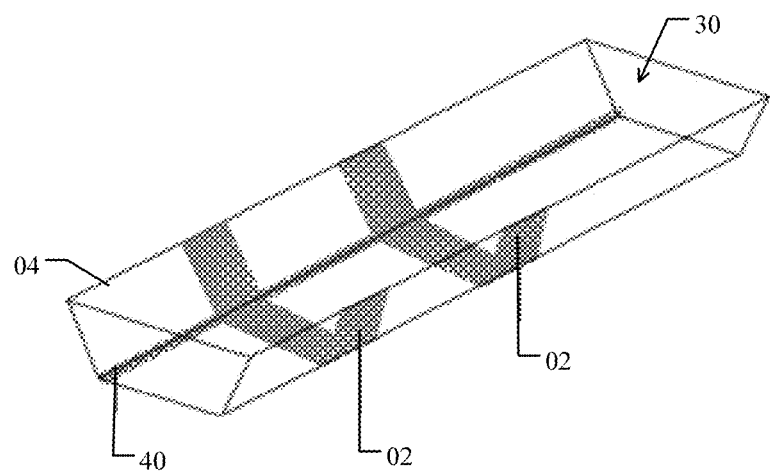
FIG. 4B is a schematic view of a short circuit caused by a metal residue in the array substrate shown in FIG. 4A.

On the other hand, if the above-mentioned signal line 02 is obtained by patterning the third metal layer 05, the problem of short circuit of the signal lines will also occur. FIG. 4A is a schematic plan view of another array substrate. FIG. 4B is a schematic view of a short circuit caused by a metal residue in the array substrate shown in FIG. 4A. FIG. 4A and FIG. 4B show only the peripheral region of the array substrate. As shown in FIG. 4A and FIG. 4B, the array substrate includes a base substrate 01, a first insulating layer (not shown) disposed on the base substrate 01, and a second insulating layer 04 disposed on the first insulating layer. For example, the second insulating layer 04 is an interlayer dielectric layer. In order to prevent a crack from spreading to the display region, at least one groove 30 is formed in the peripheral region of the array substrate. The groove 30 penetrates the first insulating layer 03 and the second insulating layer 04. When the subsequent preparation process of the third metal layer and the subsequent patterning of the third metal layer as well as formation of the signal line 02 are performed, the metal residue 40 of the third metal layer may appear at the bottom corner of the groove 30. The metal residue 40 at the bottom corner of the groove 30 electrically connects different signal lines 02, thereby causing a short circuit, and further causing poor display of the display device comprising the array substrate.

An embodiment of the disclosure provides an array substrate, a manufacturing method thereof and a display device. The array substrate comprises a base substrate; a first metal layer on the base substrate; a first insulating layer on one side of the first metal layer away from the base substrate; a second metal layer on one side of the first insulating layer away from the first metal layer; and a second insulating layer located at one side of the second metal layer away from the first insulating layer. The array substrate comprises a display area and a peripheral area surrounding the display area, the first metal layer comprises a plurality of signal lines in the peripheral area, the second insulating layer comprises at least one groove overlapping at least two signal lines in the plurality of signal lines in the peripheral area, the second metal layer comprises a metal strip in the peripheral area, and in the area where the groove overlaps the signal lines, the signal lines are in the orthographic projection of the metal strips on the base substrate in an orthographic projection on the base substrate. The array substrate can avoid the short circuit problem of signal lines caused by a metal residue in the groove formed in the insulating layer by adding an isolated metal strip on the signal lines at the position where the groove is located, thereby improving the product yield.

The array substrate, the manufacturing method thereof and the display device provided by the embodiments of the present disclosure will be described in detail below with reference to the accompanying drawings.

Figure 5A:
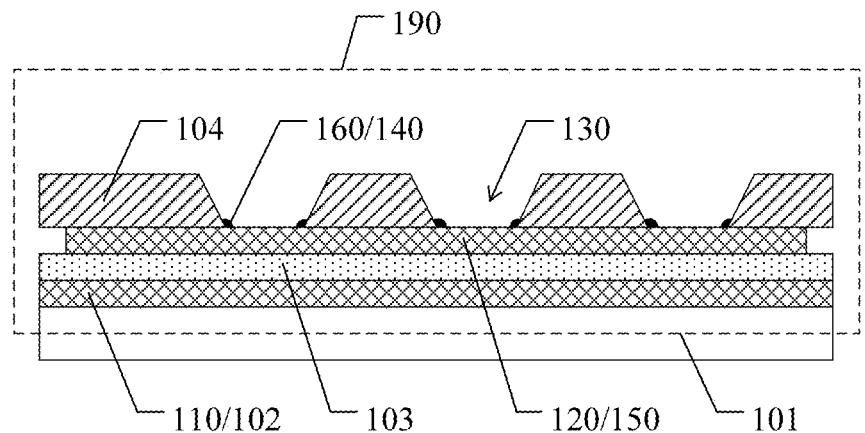
FIG. 5A and FIG. 5B are schematic cross-sectional views of an array substrate according to an embodiment of the present disclosure.
Figure 5B:
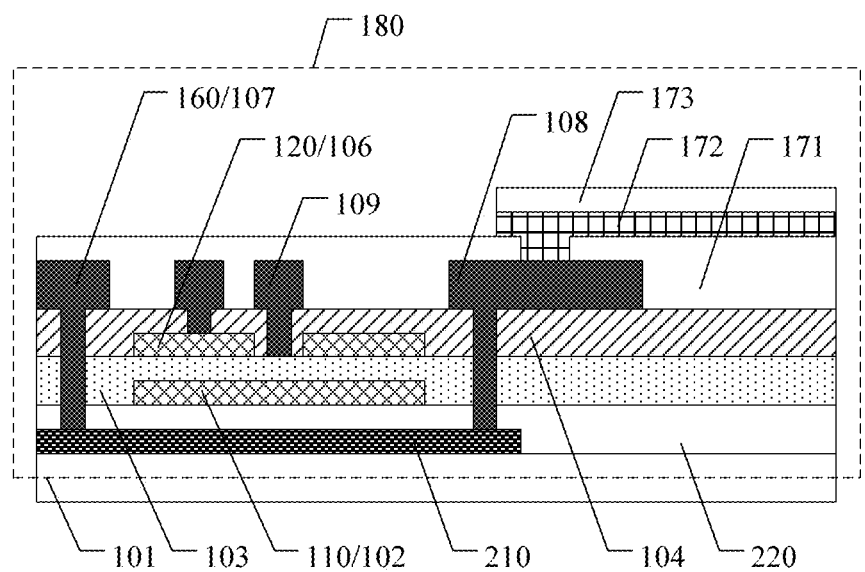

An embodiment of the present disclosure provides an array substrate. FIG. 5A and FIG. 5B are schematic cross-sectional views of an array substrate according to an embodiment of the present disclosure. FIG. 5A shows a peripheral region of the array substrate, and FIG. 5B shows a display region of the array substrate. As shown in FIG. 5A and FIG. 5B, the array substrate includes a base substrate 101; a first metal layer 110 on the base substrate 101; a first insulating layer 103 located at a side of the first metal layer 110 away from the base substrate 101; a second metal layer 120 located at a side of the first insulating layer 103 away from the first metal layer 110; and a second insulating layer 104 on a side of the second metal layer 120 away from the first insulating layer 103. The array substrate includes a display region 180 and a peripheral region 190 surrounding the display region 180. The first metal layer 110 includes a plurality of signal lines 102 in the peripheral region 190. The second insulating layer 104 includes at least one groove 130 overlapping at least two signal lines 102 in the plurality of signal lines 102 in the peripheral region 190, that is, the groove 130 overlaps at least two signal lines 102. The second metal layer 120 includes a metal strip 150 in the peripheral region 190. In the area where the groove 130 overlaps the signal line 102, the orthographic projection of the metal strip 150 on the base substrate 101 covers the orthographic projection of the signal lines 102 on the base substrate 101, that is, the orthographic projection of the signal lines 102 on the base substrate 101 falls into the orthographic projection of the metal strip 150 on the base substrate 101. It should be noted that the groove 130 can prevent a crack from spreading to the display area.

In the manufacturing process of the array substrate provided by the embodiment of the present disclosure, because the groove 130 of the second insulating layer 104 in the peripheral region 190 overlaps with at least two adjacent signal lines 102 of the plurality of signal lines 102, the problem of short-circuiting of the signal lines 102 caused by the metal residue 140 in the groove 130 may also occur in the subsequent manufacturing and patterning process of the third metal layer. However, as shown in FIG. 5A, because the orthographic projection of the metal strip 150 on the base substrate 101 covers the orthographic projection of the signal lines 102 on the base substrate 101 in the area where the groove 130 overlaps with the signal lines 102, in the process of forming the groove 130 in the second insulating layer 104, the metal strip 150 can block the etching solution (etching solution for the insulating layer) from etching the first insulating layer 103 covered by the metal strip 150, that is, the first insulating layer 103 between the signal lines 102 and the metal strip 150 will not be etched by the etching solution and is retained. Therefore, in the area where the groove 130 overlaps with the signal lines 102, in the subsequent manufacturing and patterning process of the third metal layer, even if the metal residue 140 exists, the metal residue 140 can only be connected to the metal strip 150 and cannot be connected to the signal lines 102, thereby avoiding the short circuit problem of the signal line caused by the metal residue and further improving the product yield. In addition, because the orthographic projection of the metal strip 150 on the base substrate 101 covers the orthographic projection of the signal lines 102 on the base substrate 101, in the subsequent manufacturing and patterning process of electrodes (e.g., pixel electrodes, anodes, etc.), the etching solution (the etching solution used for electrodes) can only etch the metal strip 150 at most, and the first insulating layer 103 between the signal lines 102 and the metal strip 150 can prevent the signal lines 102 from being etched; therefore, the metal strip 150 can also protect the signal lines 102.

For example, the base substrate 101 may be a glass substrate, a quartz substrate, or a plastic substrate.

For example, the first metal layer 110 may be a first gate electrode metal layer; the second metal layer 120 may be a third metal layer.

For example, in some examples, the material of the first insulating layer includes an inorganic insulating material, and the material of the second insulating layer includes an inorganic insulating material.

For example, in some examples, the second insulating layer may be an interlayer dielectric layer.

For example, the materials of the first insulating layer 103 and the second insulating layer 104 may be one or more of silicon nitride, silicon oxide, and silicon oxynitride.

For example, in some examples, as shown in FIG. 5A and FIG. 5B, the second metal layer 120 includes a conductive pattern 106 in the display region 180, and each metal strip 150 is insulated from the conductive pattern 106. That is, the metal strip 150 is isolated with respect to the conductive pattern 106. Therefore, when the metal residue 140 can only be connected to the metal strip 150, the conductive pattern 106 cannot be adversely affected. On the other hand, because the metal strip 150 is obtained by patterning the second metal layer 120 for forming the conductive pattern 106, the array substrate provided by the embodiment of the present disclosure can avoid short circuit between signal lines, has a good protection effect on the metal lines, and does not need an extra new mask process, thus saving the costs.

For example, the first metal layer may be a first gate electrode metal layer, and the first gate electrode metal layer may include a first gate electrode in the display region; the second metal layer may be a second gate electrode metal layer; at this time, the conductive pattern may be a second gate electrode.

For example, in some examples, as shown in FIG. 5A and FIG. 5B, the array substrate further includes a third metal layer 160 on a side of the second insulating layer 104 away from the second metal layer 120; the third metal layer 160 includes the metal residue 140 located at the bottom corner of the groove in the peripheral region 190. Because the third metal layer 160 is not used as a signal line, the third metal layer 160 only retains a pattern in the display region 180, and needs to be completely removed in the peripheral region 190 by a patterning process, which includes steps of exposing, developing, etching, etc. Because the third metal layer 160 formed in the groove 130 has a climbing phenomenon on the bevel edge of the groove 130, it is easy to cause that the third metal layer 160 at the bottom corner of the groove 130 cannot be completely removed to form the metal residue 140.

For example, in some examples, the third metal layer 160 includes one or more of the source electrode 107, the drain electrode 108, and the source-drain signal line 109 in the display region 190.

For example, in some examples, as shown in FIG. 5B, the array substrate further includes an active layer 210 disposed on the base substrate 101 and an insulating layer 220 disposed between the active layer 210 and the first metal layer 110.

For example, in some examples, as shown in FIG. 5B, the array substrate further includes a passivation layer 171 disposed on a side of the source electrode-drain electrode metal 160 away from the second insulating layer 104; and a pixel electrode 172 located at the display region 180 and on the side of the passivation layer 171 away from the third metal layer 160. In the preparation process and the patterning process of the pixel electrode 172, because the orthographic projection of the metal strip 150 on the base substrate 101 covers the orthographic projection of the signal lines 102 on the base substrate 101, the etching solution (etching solution used for the pixel electrode) can only etch the metal strip 150 at most, and the first insulating layer 103 between the signal lines 102 and the metal strip 150 can prevent the signal lines 102 from being etched; therefore, the metal strip 150 can also protect the signal lines 102.

For example, in some examples, the array substrate may be an array substrate of an organic light emitting diode display device. At this time, the pixel electrode may be an anode.

For example, when the array substrate may be an array substrate of an organic light emitting diode display device, as shown in FIG. 5B, the array substrate further includes an organic light emitting layer 173 on the side of the pixel electrode 172 away from the passivation layer 171.

Figure 6:
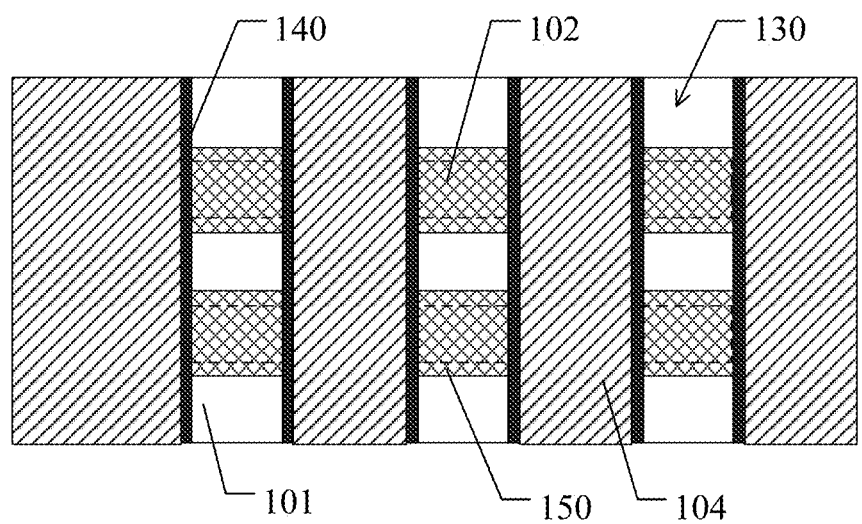
FIG. 6 is a schematic plan view of an array substrate according to an embodiment of the present disclosure.

FIG. 6 is a schematic plan view of an array substrate according to an embodiment of the present disclosure. FIG. 6 shows only the peripheral region of the array substrate. As shown in FIG. 6, there are a plurality of metal strips 150, and the plurality of metal strips 150 and the plurality of signal lines 102 are arranged in one-to-one correspondence. In the area where the groove 130 overlaps the signal lines 102, the orthographic projection of each metal strip 150 on the base substrate 101 covers the orthographic projection of the corresponding signal lines 102 on the base substrate 101, that is, the orthographic projection of each signal line 102 on the base substrate 101 falls within the orthographic projection of the corresponding metal strip 150 on the base substrate 101. Therefore, in the processing of forming the groove 130 in the second insulating layer 104, the metal strips 150 can block the etching solution (etching solution for insulating layer) from etching the first insulating layer 103 covered by the metal strips 150, that is, the first insulating layer 103 between the metal strips 150 and the corresponding signal lines 102 is not etched by the etching solution, and is retained. Therefore, in the area where the groove 130 overlaps with the signal lines 102, in the subsequent manufacturing and patterning process of the third metal layer, even if the metal residue 140 exists, the metal residue 140 can only be connected to the metal strips 150 and cannot be connected to the signal lines 102, thereby avoiding the short circuit problem of the signal lines caused by the metal residue and further improving the product yield. In addition, because the orthographic projection of the metal strips 150 on the base substrate 101 covers the orthographic projection of the corresponding signal lines 102 on the base substrate 101, in the subsequent manufacturing and patterning process of electrodes (e.g., pixel electrodes, anodes, etc.), the etching solution (etching solution used for electrodes) can only etch the metal strips 150 at most, and the first insulating layer 103 between the metal strips 150 and the corresponding signal lines 102 can prevent the signal lines 102 from being etched; therefore, the metal strips 150 can also protect the corresponding signal lines 102.

It should be noted that because the number of metal strips 150 is plural, and the plurality of metal strips 150 and the plurality of signal lines 102 are arranged in one-to-one correspondence. The array substrate does not need to be provided with a whole metal strip (metal block) with a larger area to cover all the signal lines; on one hand, the flexibility of the array substrate can be prevented from being affected by a whole metal strip (metal block) with a larger area, and on the other hand, the reflection problem caused by a whole metal strip (metal block) with a larger area can be avoided.

For example, in some examples, as shown in FIG. 6, because the number of metal strips 150 is plural, the plurality of metal strips 150 are arranged one-to-one corresponding to the plurality of signal lines 102. The groove 130 penetrates the first insulating layer 103 in a direction perpendicular to the base substrate 101 in a area where the metal strips 150 are not provided in the peripheral region 190. Therefore, short circuit between signal lines can be avoided, the metal lines are well protected, and the crack of the first insulating layer is prevented from diffusing to the display area to a greater extent.

For example, in some examples, as shown in FIG. 6, the width of each metal strip 150 is larger than the width of the signal line 102, so as to better ensure that the first insulating layer 103 between the signal lines 102 and the metal strips 150 will not be etched by an etching solution and will be preserved. It should be noted that the above-mentioned "width" refers to a dimension in a direction perpendicular to the extending direction of the signal line.

For example, in some examples, a plurality of signal lines may extend into the display area. For example, the signal lines may be scan drive lines, source-drain signal lines, or power lines, etc.

An embodiment of the present disclosure also provides a display device including the array substrate provided by any one of the above embodiments. Because the display device includes the array substrate provided in any one of the above embodiments, the display device has a technical effect corresponding to the technical effect of the display panel included in the display device, i.e., the problem of short circuit of signal lines caused by a metal residue in a groove formed in the second insulating layer can be avoided, so that the product yield can be improved. For details, please refer to the relevant description of the above embodiments, which will not be repeated here.

For example, the display device can be any electronic device with display function such as a television, a computer, a mobile phone, a navigator, a display instrument, etc.

An embodiment of the present disclosure also provides a method of manufacturing the array substrate. The manufacturing method comprises the following steps:

Step S301: a first metal layer is formed on the base substrate.

Step S302: a first insulating layer is formed on the side of the first metal layer away from the base substrate.

Step S303: a second metal layer is formed on the side of the first insulating layer away from the base substrate.

Step S304: a second insulating layer is formed on the side of the second metal layer away from the first insulating layer.

Step S305: the second insulating layer is etched to form at least one groove, the array substrate includes a display area and a peripheral area surrounding the display area, the first metal layer includes a plurality of signal lines in the peripheral area, the groove overlaps with at least two of the plurality of signal lines, the second metal layer includes a metal strip in the peripheral area, and in the area where the groove overlaps with the signal lines, the signal lines fall into the orthographic projection of the metal strip on the base substrate.

In the method of manufacturing the array substrate provided by the embodiment of the disclosure, because the groove of the second insulating layer in the peripheral region overlaps with at least two adjacent signal lines in the plurality of signal lines, the problem of short circuit of the signal lines caused by a metal residue in the groove will also occur in the subsequent manufacturing and patterning process of the third metal layer. However, because the orthographic projection of the metal strip on the base substrate covers the orthographic projection of the signal line on the base substrate in the area where the groove overlaps with the signal line, in the process of forming the groove in the second insulating layer, the metal strip can block the etching solution (etching solution used for the insulating layer) from etching the first insulating layer covered by the metal strip, that is, the first insulating layer between the signal lines and the metal strip will not be etched by the etching solution and is retained. Therefore, in the area where the groove overlaps with the signal lines, in the subsequent manufacturing and patterning process of the third metal layer, even if there is a metal residue, the metal residue can only be connected with the metal strip and cannot be connected with the signal lines, thus avoiding the short circuit problem of the signal lines caused by the metal residue and further improving the product yield. In addition, because the orthographic projection of the metal strip on the base substrate covers the orthographic projection of the signal lines on the base substrate, in the subsequent manufacturing and patterning process of electrodes (e.g., pixel electrodes, anodes, etc.), the etching solution (etching solution used for electrodes) can only etch the metal strip at most, and the first insulating layer between the wire and the metal strip can prevent the signal lines from being etched; therefore, the metal strip can also protect the signal lines.

For example, the base substrate may be a glass substrate, a quartz substrate, or a plastic substrate.

For example, the first metal layer may be a first gate electrode metal layer; the second metal layer may be a third metal layer.

For example, in some examples, the material of the first insulating layer includes an inorganic insulating material, and the material of the second insulating layer includes an inorganic insulating material.

For example, in some examples, the second insulating layer may be an interlayer dielectric layer.

For example, the materials of the first insulating layer and the second insulating layer may be one or more of silicon nitride, silicon oxide and silicon oxynitride.

Figure 7A:
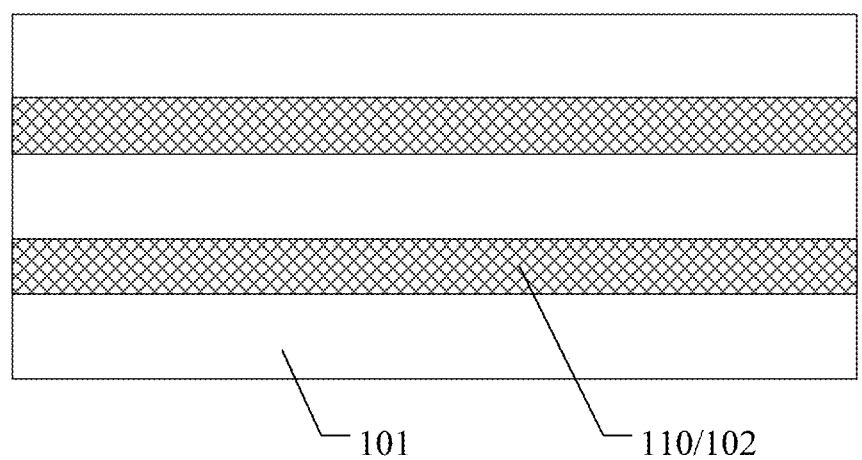
FIG. 7A to FIG. 7F are schematic views showing steps of a manufacturing method of an array substrate according to an embodiment of the present disclosure.
Figure 7B:
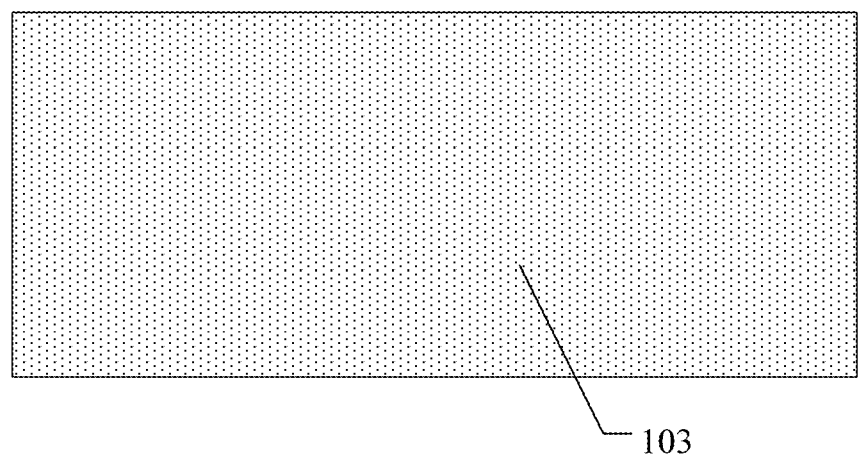
Figure 7C:
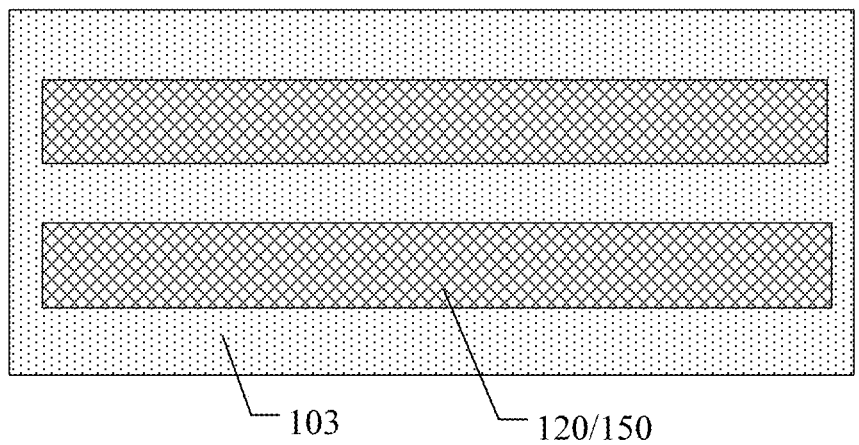
Figure 7D:
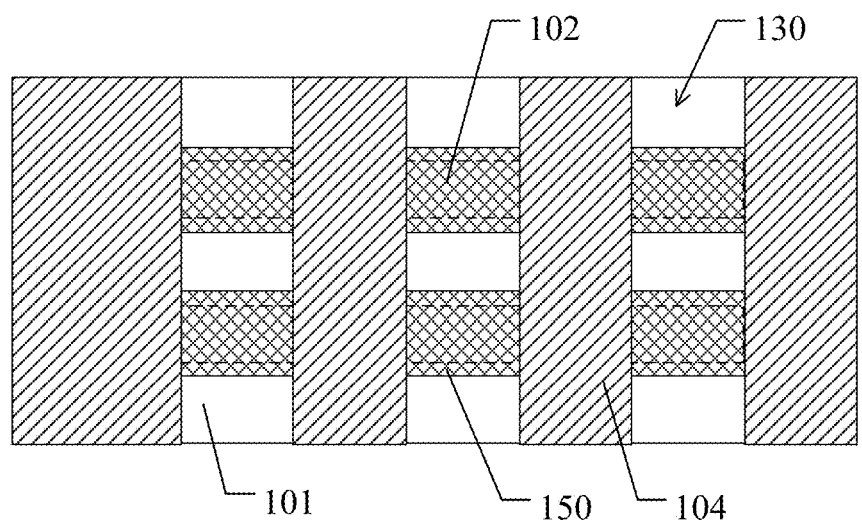

FIG. 7A to FIG. 7F are schematic views of the steps of a method of manufacturing an array substrate according to an embodiment of the present disclosure. FIG. 7A to FIG. 7F show only the peripheral region of the array substrate. As shown in FIG. 7A, a first metal layer 110 including a plurality of signal lines 102 in a peripheral region is formed on the base substrate 101. As shown in FIG. 7B, a first insulating layer 103 is formed on a side of the first metal layer 110 away from the base substrate 101. As shown in FIG. 7C, a second metal layer 120 is formed on the side of the first insulating layer 103 away from the base substrate 101, and the second metal layer 120 includes a metal strip 150 in a peripheral region. As shown in FIG. 7D, a second insulating layer 104 is formed on the side of the second metal layer 120 away from the first insulating layer 103. The second insulating layer 104 is etched to form at least one groove 130 that overlaps at least two adjacent signal lines 102 of the plurality of signal lines 102. In the area where the groove 130 overlaps the signal lines 102, the orthographic projection of the metal strip 150 on the base substrate 101 covers the orthographic projection of the signal lines 102 on the base substrate 101. In the area where the groove 130 overlaps with the signal lines 102, the first insulating layer 103 between the signal lines 102 and the metal strip 050 is not etched by the etching solution and is retained.

Figure 7E:
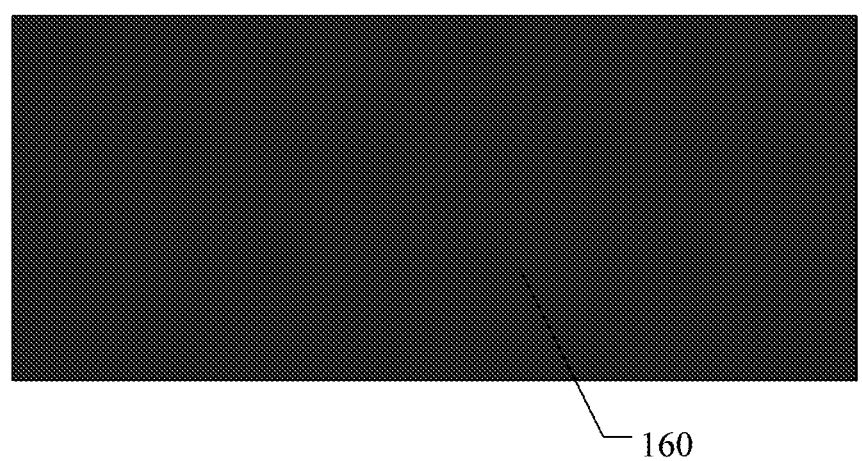
Figure 7F:
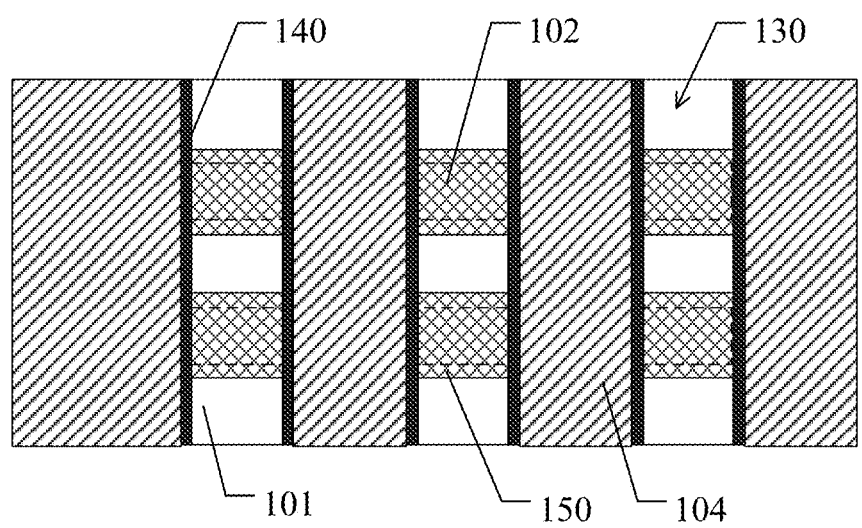

As shown in FIG. 7E, a third metal layer 160 is deposited on the above-mentioned substrate, and at the same time the third metal layer 160 is also deposited in the groove 130. As shown in FIG. 7F, the third metal layer 160 is etched and the third metal layer 160 of the peripheral region 190 is removed. Because the third metal layer 160 is also deposited in the groove 30, a metal residue 140 is easily formed at the bottom corner of the groove 130 during etching of the third metal layer 160. As shown in FIG. 7F, in the area where the groove 130 overlaps the signal lines 102, even if there is a metal residue 140, the metal residue 140 can only be connected to the metal strip 150 and cannot be connected to the signal line 102, thereby avoiding the short circuit problem of the signal line caused by the metal residue and further improving the product yield.

For example, in some examples, the number of metal strips 150 is plural, and the plurality of metal strips 150 are arranged one-to-one corresponding to the plurality of signal lines 102. In the area where the groove 130 overlaps the signal lines 102, the orthographic projection of each metal strip 150 on the base substrate 101 covers the orthographic projection of the corresponding signal lines 102 on the base substrate 101, that is, the orthographic projection of each signal line on the base substrate falls into the orthographic projection of the corresponding metal strip on the base substrate.

For example, in some examples, as shown in FIG. 6, the width of each metal strip 150 is larger than the width of the signal line 102, so as to better ensure that the first insulating layer 103 between the signal lines 102 and the metal strips 150 will not be etched by the etching solution and will be retained. It should be noted that the above-mentioned width refers to a dimension in a direction perpendicular to the extending direction of the signal line.

For example, in some examples, the second metal layer includes a conductive pattern in the display region, each metal strip is insulated from the conductive pattern, and the metal strip and the conductive pattern are fabricated in a same mask process. Therefore, the method of manufacturing the array substrate provided by the embodiment of the disclosure can avoid short circuits between signal lines, plays a good role in protecting metal lines, and does not add a new mask process at the same time, thus saving the cost.

The following points need to be explained:

(1) In the drawings of the embodiments of the present disclosure, only the structures related to the embodiments of the present disclosure are involved, and other structures may refer to the common design.

(2) Without conflict, features in the same embodiment and different embodiments of the present disclosure can be combined with each other.

The above is only a specific embodiment of the present disclosure, but the protection scope of the present disclosure is not limited to this. Any person familiar with the technical field can easily think of changes or substitutions within the technical scope of the present disclosure, and should be covered within the protection scope of the present disclosure. Therefore, the scope of protection of the present disclosure shall be subject to the scope of protection of the claims.

What is claimed is:

1. An array substrate comprising:
   a base substrate;
   a first metal layer on the base substrate;
   a first insulating layer on one side of the first metal layer away from the base substrate;
   a second metal layer on one side of the first insulating layer away from the base substrate; and
   a second insulating layer on one side of the second metal layer away from the base substrate,
   wherein the array substrate comprises a display area and a peripheral area surrounding the display area, the first metal layer comprises a plurality of signal lines in the peripheral area, the second insulating layer comprises at least one groove overlapping at least two signal lines in the plurality of signal lines in the peripheral area, the second metal layer comprises at least one metal strip in the peripheral area, and
   in an area where the groove overlaps the signal lines, an orthographic projection of the signal lines on the base substrate falls into an orthographic projection of the metal strip on the base substrate.

2. The array substrate according to claim 1, wherein the at least one metal strip comprises a plurality of metal strips, the plurality of metal strips are arranged one-to-one corresponding to the plurality of signal lines, and an orthographic projection of each signal line on the base substrate falls into an orthographic projection of a corresponding metal strip arranged on the base substrate in an area where the groove overlaps with the signal lines.

3. The array substrate according to claim 2, wherein the plurality of signal lines extend into the display region.

4. The array substrate according to claim 2, wherein the second metal layer comprises a conductive pattern in the display region, and each of the metal strips is insulated from the conductive pattern.

5. The array substrate according to claim 2, wherein a material of the first insulating layer comprises an inorganic insulating material and a material of the second insulating layer comprises an inorganic insulating material.

6. The array substrate according to claim 2, wherein the groove penetrates the first insulating layer in a direction perpendicular to the base substrate in an area where the metal strip is not provided in the peripheral region.

7. The array substrate according to claim 2, wherein the first metal layer is a first gate electrode metal layer and the second metal layer is a second gate electrode metal layer.

8. The array substrate according to claim 1, wherein a width of each of the metal strips is larger than a width of each of the signal lines in the area where the groove overlaps the signal lines.

9. The array substrate according to claim 1, wherein a material of the first insulating layer comprises an inorganic insulating material and a material of the second insulating layer comprises an inorganic insulating material.

10. The array substrate according to claim 1, wherein the groove penetrates the first insulating layer in a direction perpendicular to the base substrate in an area where the metal strip is not provided in the peripheral region.

11. The array substrate according to claim 1, wherein the first metal layer is a first gate electrode metal layer and the second metal layer is a second gate electrode metal layer.

12. The array substrate according to claim 1, wherein the second insulating layer comprises an interlayer dielectric layer.

13. The array substrate according to claim 1, further comprising:
a third metal layer on one side of the second insulating layer away from the second metal layer,
wherein the third metal layer comprises a metal residue located at the bottom corner of the groove in the peripheral region.

14. The array substrate of claim 13, wherein the third metal layer comprises at least one of a source electrode, a drain electrode, and a source-drain signal line in the display region.

15. The array substrate according to claim 14, further comprising:
a passivation layer disposed on one side of the third metal layer away from the second insulating layer; and
a pixel electrode in the display region and on one side of the passivation layer away from the third metal layer.

16. A display device comprising the array substrate according to claim 1.

17. A method of manufacturing an array substrate, comprising:
forming a first metal layer on the base substrate;
forming a first insulating layer on one side of the first metal layer away from the base substrate;
forming a second metal layer on a side of the first insulating layer away from the base substrate;
forming a second insulating layer on one side of the second metal layer away from the base substrate; and
etching the second insulating layer to form at least one groove,
wherein the array substrate comprises a display area and a peripheral area surrounding the display area, the first metal layer comprises a plurality of signal lines in the peripheral area, the groove overlaps at least two signal lines in the plurality of signal lines, the second metal layer comprises at least one metal strip in the peripheral area, and in an area where the groove overlaps the signal lines, an orthographic projection of the signal lines on the base substrate falls into an orthographic projection of the metal strips on the base substrate.

18. The method of manufacturing the array substrate according to claim 17, wherein the at least one metal strip comprises a plurality of metal strips, the plurality of metal strips are arranged one-to-one corresponding to the plurality of signal lines, and an orthographic projection of each of the signal lines on the base substrate falls into an orthographic projection of a corresponding metal strip arranged on the base substrate in the area where the groove overlaps with the signal lines.

19. The method of manufacturing the array substrate according to claim 14, wherein a width of each of the metal strips is larger than a width of each of the signal lines in the area where the groove overlaps the signal lines.

20. The method of manufacturing the array substrate according to claim 14, wherein the second metal layer comprises a conductive pattern in the display region, each of the metal strips is insulated from the conductive pattern, and the metal strips and the conductive pattern are manufactured in a same mask process.

* * * * *